United States Patent
Khemka et al.

(10) Patent No.: US 6,693,339 B1
(45) Date of Patent: Feb. 17, 2004

(54) SEMICONDUCTOR COMPONENT AND METHOD OF MANUFACTURING SAME

(75) Inventors: Vishnu Khemka, Phoenix, AZ (US); Vijay Parthasarathy, Phoenix, AZ (US); Ronghua Zhu, Chandler, AZ (US); Amitava Bose, Tempe, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/389,401

(22) Filed: Mar. 14, 2003

(51) Int. Cl.$^7$ ................................................ H01L 29/72

(52) U.S. Cl. ...................... 257/492; 257/493; 257/495; 257/498; 257/295; 438/301; 438/343; 438/603

(58) Field of Search ................................. 257/492, 493, 257/495, 498, 295; 438/301, 343, 603

(56) References Cited

U.S. PATENT DOCUMENTS 5,430,403 A * 7/1995 Moyer et al. ............... 257/492

OTHER PUBLICATIONS

Esmark, et al.; *Simulation and Experimental Study of Temperature Distribution During ESD Stress in Smart–Power Technology ESD Protection Structures*; 2000 Int'l Reliability Physics Symp., pp. 304–309.

Bertrand, et al.; *Analysis and Compact Modeling of a Vertical Grounded–Based n–p–n Bipolar Transistor Used as ESD Protection in a Smart Power Technology; IEEE Journal of Solid–State Circuits*, Sep. 2001, pp. 1373–1381.

DeHeyn, et al.; *Design and Analysis of New Protection Structures for Smart Power Technology with Controlled Trigger and Holding Voltage*; 2001 Int'l Realiability Physics Symp., pp. 253–258.

Duvvury, et al.; *Lateral DMOS Design for ESD Robustness*; 1997 Int'l Electron Devices Meeting; pp. 375–378.

Parthasarathy, et al.; *SOA Improvement by a Double RESURF LDMOS Technique in a Power IC Technology*; 2000 Int'l Electron Devices Meeting, pp. 75–78.

Zhu, et al.; *Implementation of High–Side, High–Voltage RESURF LDMOS in a sub–half Micron Smart Power Technology*; 2001 Int'l Symp. On Power Semiconductor Devices; pp. 403–406.

Parthasarathy, et al.; *Drain Profile Engineering of RESURF LDMOS Devices for ESD Ruggedness*; 2002 Int'l Symp. On Power Semiconductor Devices; pp 265–265.

Parthasarathy, et al.; *A Double RESURF LDMOS With Drain Profile Engineering for Improved ESD Robustness; IEEE Electron Device Letters*, Apr. 2002, pp. 212–214.

Mergens, et al.; *Analysis of Lateral DMOS Power Devices Under ESD Stress Conditions; IEEE Transactions on Electron Devices*, Nov. 2000, pp. 2128–2137.

(List continued on next page.)

*Primary Examiner*—Edward Wojciechowicz
(74) *Attorney, Agent, or Firm*—Bryan Cave LLP (57) ABSTRACT

A semiconductor component includes a first semiconductor region (110, 210) having a first conductivity type and a second semiconductor region (120, 220) above the first semiconductor region and having a second conductivity type. The semiconductor component further comprises a third semiconductor region (130, 230) above the second semiconductor region and having the first conductivity type, a fourth semiconductor region (140, 240) above the third semiconductor region and having the second conductivity type, a fifth semiconductor region (150, 250) above the third semiconductor region and having the first conductivity type, a sixth semiconductor region (160, 260) substantially enclosed within the fifth semiconductor region and having the second conductivity type, and a seventh semiconductor region (170, 270) above the first semiconductor region and having the second conductivity type. The seventh semiconductor region is adjacent to the third and fourth semiconductor regions, and is separated from the fifth semiconductor region.

28 Claims, 4 Drawing Sheets

OTHER PUBLICATIONS

Moscatelli, et al.; *LDMOS Implementation in a 0.35 μm BCD Technology (BCD6); 2000 Int'l Symp. On Power Semiconductor Devices*, pp. 323–326.

Gobner, et al.; *Wide Range Control of the Sustaining Voltage of ESD Protection Elements Realized in a Smart Power Technology; 1999 EOS/ESD Symp.*, pp 19–27.

* cited by examiner

SEMICONDUCTOR COMPONENT AND METHOD OF MANUFACTURING SAME

FIELD OF THE INVENTION

This invention relates generally to semiconductor components, and relates more particularly to transistors and methods of manufacture.

BACKGROUND OF THE INVENTION

The metal-oxide semiconductor field-effect transistor (MOSFET) enjoys widespread use in a large number of electronics technologies. The lateral double diffused power MOSFET (LDMOS) device is heavily used in smart power technologies where device size is at a premium. The small size and high complexity of LDMOS devices makes them especially vulnerable to electrostatic discharge (ESD) strikes, in which large currents are suddenly forced onto an LDMOS device. ESD strikes are of particular concern for medium sized, 30–50 volt (V) LDMOS devices, especially in the 2-ohm to 20-ohm range, which are connected to high voltage pads in various automotive and consumer applications such as air bag deployment systems and printer head drivers. If an LDMOS device is left unprotected, an ESD strike can lead to thermally-induced soft degradation of leakage current from low pre-stress levels due to current crowding, which can cause non-uniform heating and localized silicon melting damage in the vicinity of the drain.

Conventional ESD-protected LDMOS devices are either self-protected, meaning the ESD-protection arises from some feature internal to the LDMOS device itself, or externally-protected, meaning the ESD-protection is accomplished outside of the LDMOS. Typical self-protected devices rely on the engineering of semiconductor regions. As an example, the volume of the body region enclosing the source region of an LDMOS may be increased, but this approach leads to the unwanted result of increasing overall device size. As another example, the doping level of the body region may be increased, but this approach increases the threshold voltage, which is also an unwanted result. As still another example, the drift length of the LDMOS may be increased. This too increases the size of the device, typically by a factor of two or three.

The external protection methods are equally problematic. External ESD protection in a conventional LDMOS device is achieved by providing zener diodes, capacitors, and/or other circuit elements in various circuit configurations with the LDMOS device in order to absorb the ESD energy. The added circuit elements increase the overall area consumption of the LDMOS device, just as do the conventional self-protection approaches. In addition, external ESD protection is difficult to design, due to a narrow voltage window between the maximum rated pad voltage and the breakdown voltage of the LDMOS device.

Accordingly, there is a need for an ESD-protected semiconductor device that does not rely on increases in size or doping level for such protection. Ideally, the ESD-protected LDMOS device would be more robust in terms of ESD protection than existing devices, and would fit into existing manufacturing flows.

BRIEF DESCRIPTION OF THE DRAWINGS

The invention will be better understood from a reading of the following detailed description, taken in conjunction with the accompanying figures in the drawings in which.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner.

DETAILED DESCRIPTION OF THE DRAWINGS

In one embodiment of the invention, a semiconductor component comprises a first semiconductor region having a first conductivity type and a second semiconductor region located above the first semiconductor region and having a second conductivity type. The semiconductor component further comprises a third semiconductor region located above the second semiconductor region and having the first conductivity type, a fourth semiconductor region located above the third semiconductor region and having the second conductivity type, a fifth semiconductor region located above the third semiconductor region and having the first conductivity type, a sixth semiconductor region substantially enclosed within the fifth semiconductor region and having the second conductivity type, and a seventh semiconductor region located above the first semiconductor region and having the second conductivity type. In a particular embodiment of the invention, the seventh semiconductor region is adjacent to the third semiconductor region and the fourth semiconductor region, and is separated from the fifth semiconductor region.

Figure 1:
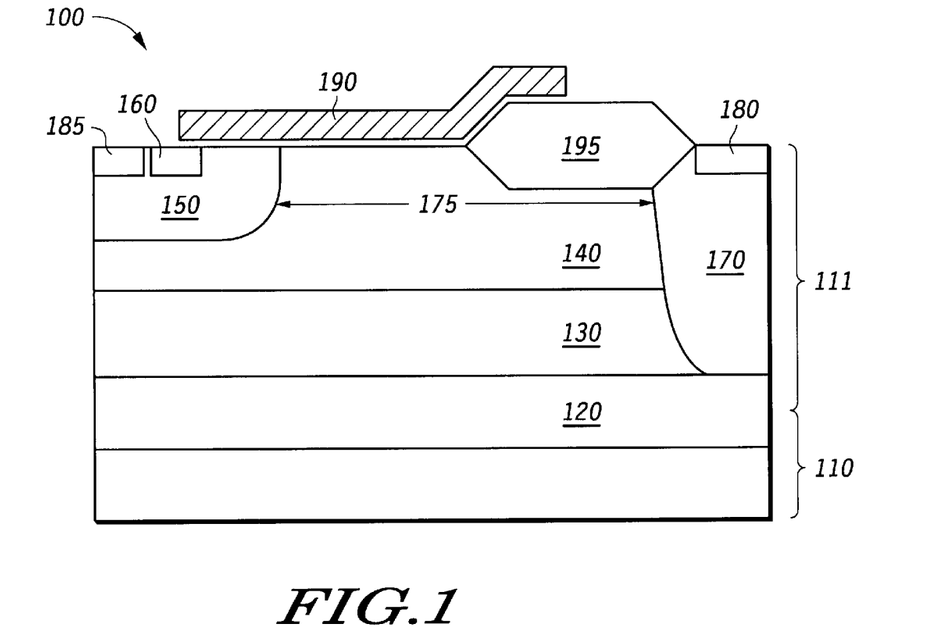
FIG. 1 is a cross sectional view of a portion of a semiconductor component according to an embodiment of the invention.

Refer now to FIG. 1, which is a cross sectional view of a portion of a semiconductor component according to an embodiment of the invention. As an example, the semiconductor component can be a discrete component or an integrated circuit. A semiconductor device 100 comprises a semiconductor region 110, a semiconductor epitaxial layer 111 located above semiconductor region 110, a semiconductor region 120 located in semiconductor epitaxial layer 111 and in semiconductor region 110, a semiconductor region 130 located in semiconductor epitaxial layer 111 and above semiconductor region 120, a semiconductor region 140 located in semiconductor epitaxial layer 111 and above semiconductor region 130, a semiconductor region 150 located in semiconductor epitaxial layer 111 and above semiconductor region 130, a semiconductor region 160 located in semiconductor epitaxial layer 111 and substantially enclosed within semiconductor region 150, and a semiconductor region 170 located in semiconductor epitaxial layer 111 and above semiconductor region 120. In one embodiment, semiconductor region 160 and semiconductor region 150 are contiguous with each other and are electrically shorted together. Semiconductor region 110, semiconductor epitaxial layer 111, semiconductor region 130, and semiconductor region 150 have a first conductivity type. Semiconductor region 120, semiconductor region 140, semiconductor region 160, and semiconductor region 170 have a second conductivity type. In one embodiment, semiconductor region 130 is at least partially contiguous with semiconductor region 120. In the same or a different embodiment, semiconductor region 140 is at least partially contiguous with semiconductor region 130.

It will be apparent to a person having ordinary skill in the art that semiconductor device 100 is a reduced surface field (RESURF) transistor. More specifically, semiconductor device 100 is a double RESURF transistor, in which semiconductor region 120, semiconductor region 140, and semiconductor region 170 deplete semiconductor region 130 when a reverse bias is applied between semiconductor region 140 and semiconductor region 150.

Semiconductor region 170 is adjacent to semiconductor region 130 and semiconductor region 140. Semiconductor region 130 and semiconductor region 140 separate semiconductor region 170 from semiconductor region 150 by a separation distance 175, which in one embodiment is greater than one micrometer. Separation distance 175 may be increased or decreased according to the breakdown voltage requirements of semiconductor device 100. In general, the breakdown voltage of semiconductor device 100 will increase with an increase in separation distance 175, and will decrease with a decrease in separation distance 175. In a particular embodiment, semiconductor region 170 is adjacent to semiconductor region 120. In a different embodiment, semiconductor region 170 is separated from semiconductor region 120 by at least a portion of semiconductor region 130.

Semiconductor device 100 may further comprise a semiconductor region 180 located in semiconductor epitaxial layer 111 and above semiconductor region 170, and having the second conductivity type. In one embodiment, semiconductor region 180 is substantially enclosed within semiconductor region 170.

In a particular embodiment, semiconductor epitaxial layer 111 and semiconductor regions 110, 120, 130, 140, 150, 160, 170, and 180 form portions of an LDMOS device. In that particular embodiment, semiconductor region 160 comprises a source region, and semiconductor region 180 comprises a drain region. In another particular embodiment, semiconductor epitaxial layer 111 and semiconductor regions 110, 120, 130, 140, 150, 160, 170, and 180 form portions of a bipolar junction transistor. In that particular embodiment, semiconductor region 160 comprises an emitter region, and semiconductor region 180 comprises a collector region.

In one embodiment, semiconductor region 170 is more heavily doped than both semiconductor region 140 and semiconductor region 130. In the same or another embodiment, semiconductor region 120, semiconductor region 160, and semiconductor region 170 are more heavily doped than semiconductor region 110, semiconductor region 130, semiconductor region 140, and semiconductor region 150.

As an example of a particular embodiment of semiconductor device 100, semiconductor region 110 comprises a P-type semiconductor substrate, semiconductor epitaxial layer 111 comprises a P-type epitaxial layer, semiconductor region 120 comprises a heavily-doped N-type buried layer, semiconductor region 130 comprises an original portion of the P-type semiconductor epitaxial layer 111, semiconductor region 140 comprises an N-type drift region, semiconductor region 150 comprises a P-type body region, semiconductor region 160 comprises a heavily doped N-type source region, semiconductor region 170 comprises a heavily doped, deep N-type sinker tie, and semiconductor region 180 comprises a heavily doped N-type drain region. Semiconductor region 120 and semiconductor region 170 may have a doping concentration of approximately $10^{18}$ atoms per cubic centimeter. Semiconductor region 130 may have a doping concentration of approximately $10^{15}$ atoms per cubic centimeter. Semiconductor region 140 may have a doping concentration of approximately $10^{16}$ atoms per cubic centimeter. Semiconductor region 150 may have a doping concentration greater than approximately $10^{17}$ atoms per cubic centimeter. Semiconductor region 160 and semiconductor region 180 may have a doping concentration of approximately $10^{20}$ atoms per cubic centimeter.

Semiconductor device 100 further comprises a semiconductor region 185, a gate electrode 190, and an oxide region 195. Semiconductor region 185 has the first conductivity type. In one embodiment, semiconductor region 185 comprises a heavily doped P-type body contact region. Gate electrode 190 and oxide region 195 may be formed using conventional methods.

Figure 2:
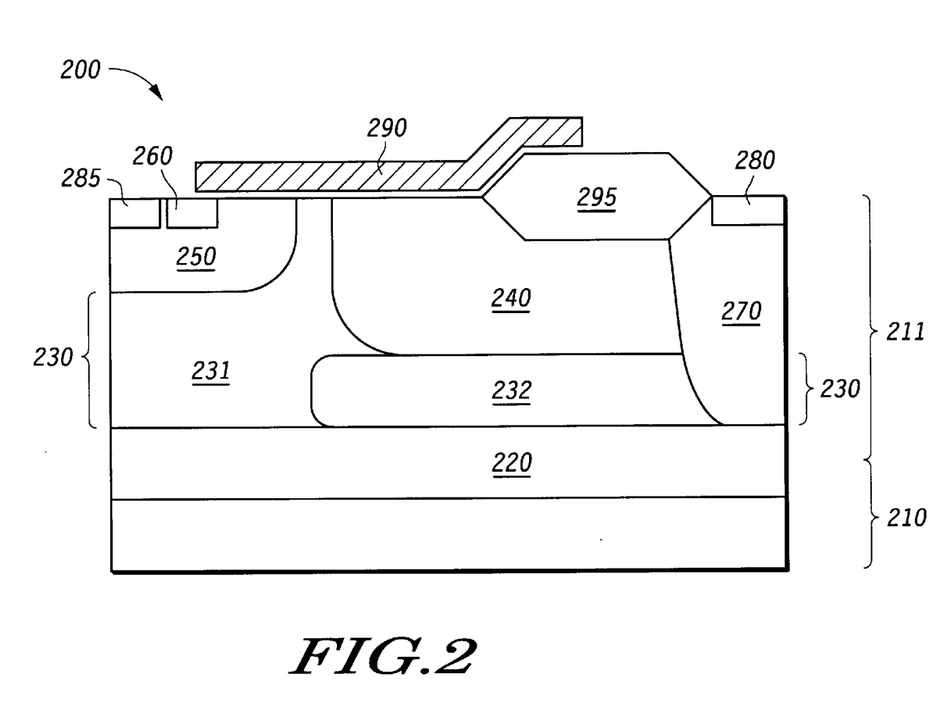
FIG. 2 is a cross sectional view of a portion of a semiconductor component according to another embodiment of the invention.

Refer now to FIG. 2, which is a cross sectional view of a portion of a semiconductor component according to another embodiment of the invention. As an example, the semiconductor component can be a discrete component or an integrated circuit. A semiconductor device 200 comprises a semiconductor region 210, a semiconductor epitaxial layer 211 located above semiconductor region 210, a semiconductor region 220 located in semiconductor epitaxial layer 211 and in semiconductor region 210, and a semiconductor region 230 located in semiconductor epitaxial layer 211 and above semiconductor region 220. Semiconductor device 200 further comprises a semiconductor region 240 located in semiconductor epitaxial layer 211 and above semiconductor region 220, a semiconductor region 250 located in semiconductor epitaxial layer 211 and above semiconductor region 220, a semiconductor region 260 located in semiconductor epitaxial layer 211 and substantially enclosed within semiconductor region 250, and a semiconductor region 270 located in semiconductor epitaxial layer 211 and above semiconductor region 220. In one embodiment, semiconductor region 250 is at least partially contiguous with semiconductor region 230.

As an example, semiconductor device 200 can be similar to semiconductor device 100 in FIG. 1. As a further example, semiconductor regions 210, 220, 230, 240, 250, 260, and 270 can be similar to, respectively, semiconductor regions 110, 120, 130, 140, 150, 160, and 170 in FIG. 1, and semiconductor epitaxial layer 211 can be similar to semiconductor epitaxial layer 111 in FIG. 1.

In one embodiment, semiconductor device 200 further comprises a semiconductor region 280 located in semiconductor epitaxial layer 211 and above semiconductor region 270, and having the second conductivity type. As an example, semiconductor region 280 can be similar to semiconductor region 180 in FIG. 1.

Semiconductor device 200 still further comprises a semiconductor region 285, a gate electrode 290, and an oxide region 295. As an example, semiconductor region 285 can be similar to semiconductor region 185 in FIG. 1. As a further example, gate electrode 290 and oxide region 295 may be similar to gate electrode 190 and oxide region 195, respectively, in FIG. 1.

Semiconductor region 230 comprises a portion 231 and a portion 232. At least a substantial part of portion 231 is located under semiconductor region 250, and at least a substantial part of portion 232 is located under semiconductor region 240. In one embodiment, a doping concentration of portion 231 is less than a doping concentration of portion 232.

Figure 3:
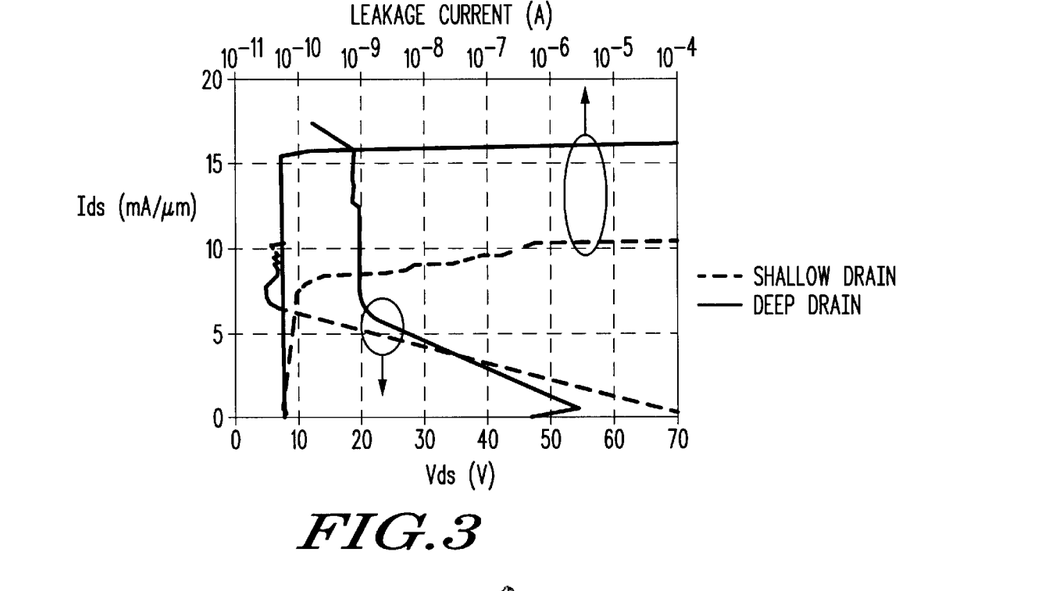
FIG. 3 is a graph depicting values of leakage current and drain voltage for a conventional semiconductor component and for a semiconductor component according to an embodiment of the invention.

Refer now to FIG. 3, which is a graph depicting values of leakage current and drain voltage for a conventional semiconductor component and for a semiconductor component according to an embodiment of the invention. FIG. 3 shows the results of a transmission line pulsed (TLP) measurement with pulse width of 100 nanoseconds (ns) and rise time of less than one ns in order to trace the device behavior of two LDMOS devices after snapback. The dashed line traces the behavior of a conventional LDMOS device having a shallow drain. The solid line traces the behavior of a semiconductor device according to an embodiment of the invention, also referred to as a "deep drain device" in the following discussion.

In the shallow drain case a hard second breakdown failure is reached at a drain current ($I_{ds}$) of 10 milliamps (mA) per micrometer ($\mu$m). Hard second breakdown failure is defined as the point when the measured leakage current rapidly increases and hits a 10 microamp ($\mu$A) level. In the shallow drain device there is a soft degradation in leakage current even before hard destruction that occurs immediately upon snapback. This increase in leakage current is evidence of early onset of filamentation typical of LDMOS devices with strong snapback behavior.

In the semiconductor device according to an embodiment of the invention, FIG. 3 shows that there is no soft degradation in leakage current after the parasitic bipolar junction transistor turns on. The leakage current remains constant at the pre-stress level until hard failure is reached at a drain current of approximately 16 mA/$\mu$m, at which point the leakage current increases sharply to reach 10 $\mu$A. This clearly demonstrates an absence of any silicon damage following snapback, which indicates that current filamentation has been eliminated in the deep drain device. The value of the current at hard failure for the deep drain device is 60% higher than for the shallow drain case. The measured holding voltage ($V_H$) and second breakdown voltage ($V_{t2}$) for the deep drain device are 20V and 19V, which are larger compared to 6V and 8V respectively in the shallow drain structure. Hence, the difference in maximum ESD power between the two structures is even more pronounced than the difference in current at hard failure.

Figure 4:
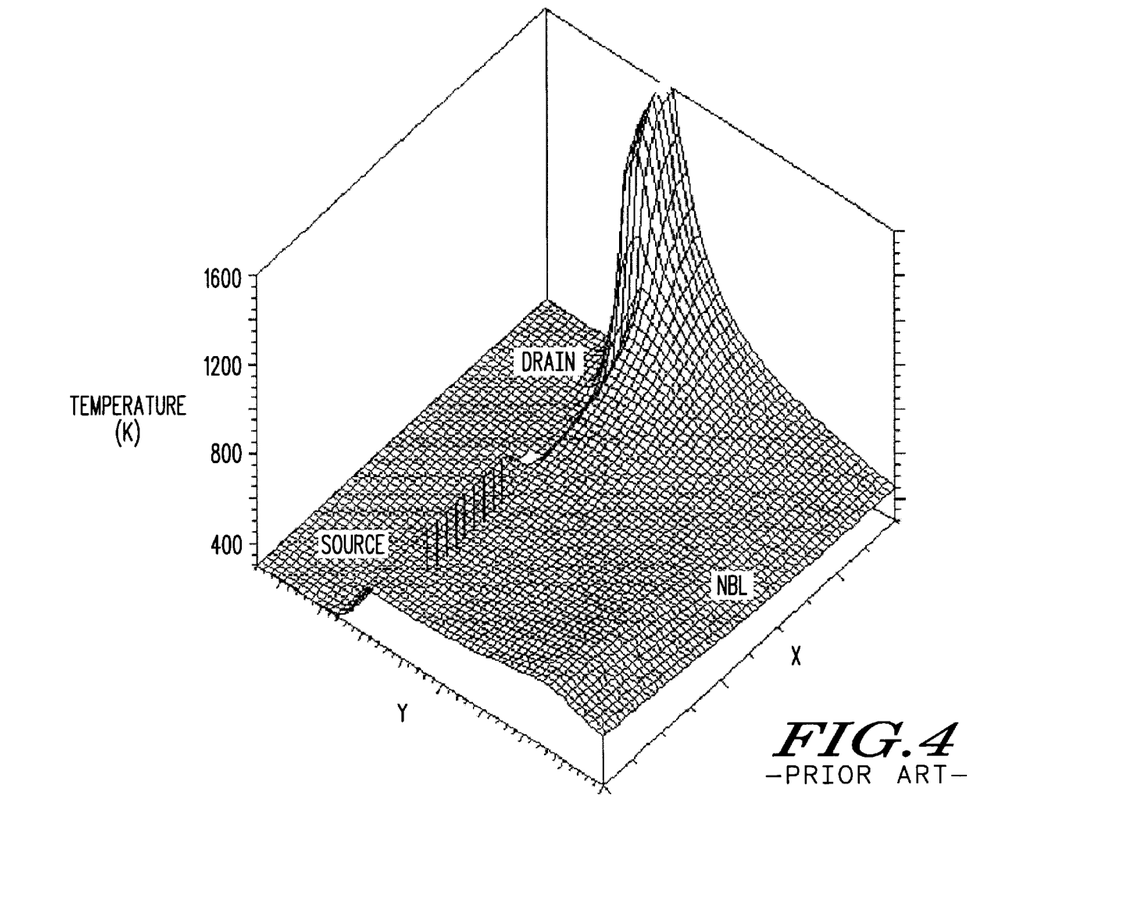
FIG. 4 is a temperature profile for a conventional semiconductor device.

Refer now to FIG. 4, which is a temperature profile for a conventional semiconductor device. The conventional, shallow drain LDMOS device is characterized by conductivity modulation occurring in the entire N-drift region and in the P- region below it. This results in significant lateral bipolar current flow, focused in the vicinity of the drain. The conductivity modulation wipes out the background charge, causing the electric field collapse toward the drain. The significant impact ionization generated at the sharp and shallow drain junction edge sustains the bipolar conduction with a low $V_H$ of approximately 6V. The region of maximum power dissipation for the shallow drain device is a very small volume below the drain junction. This results in a localized temperature increase in excess of 1000 degrees Celsius (C) near the silicon surface of the drain at the end of the 100 ns ESD pulse, as depicted in FIG. 4. The significant temperature spike causes melting and silicon damage near the drain, which is manifested in an increase in leakage current after snapback even before the onset of hard failure, as discussed above in connection with FIG. 3.

Figure 5:
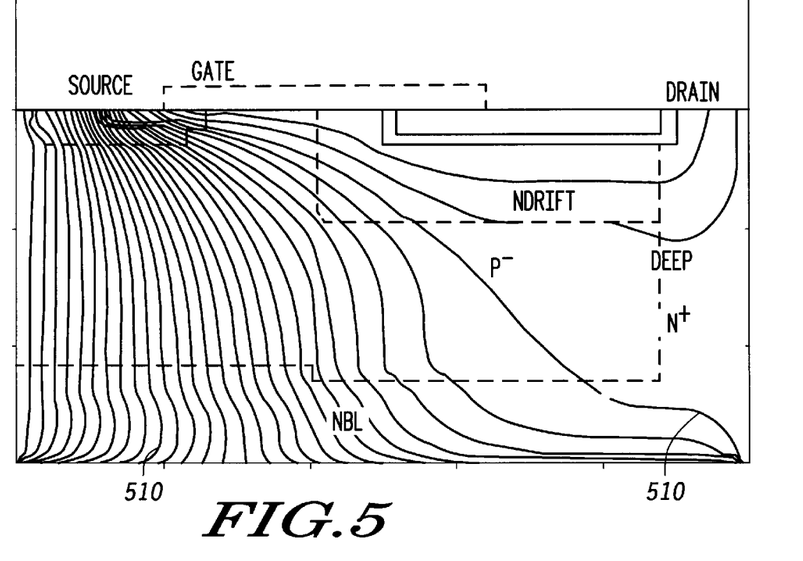
FIG. 5 is a graph depicting simulated current flow in a semiconductor component according to an embodiment of the invention.

Refer now to FIG. 5, which is a graph depicting simulated current flow in a semiconductor component according to an embodiment of the invention. Simulated current lines 510 show that during the entire duration of the 100 ns pulse the conductivity modulation is suppressed in the vicinity of the deep drain. This is due to the shorting of the N-drift/P-junction by the deep N+ sinker. Hence, the electric field collapses toward the NBL/P- collector junction. Since the NBL/P- collector junction is more graded compared to the shallow drain junction, less impact ionization is generated at the NBL/P- collector junction. A higher measured $V_H$ of 20V is, therefore, required to sustain the bipolar conduction.

Figure 6:
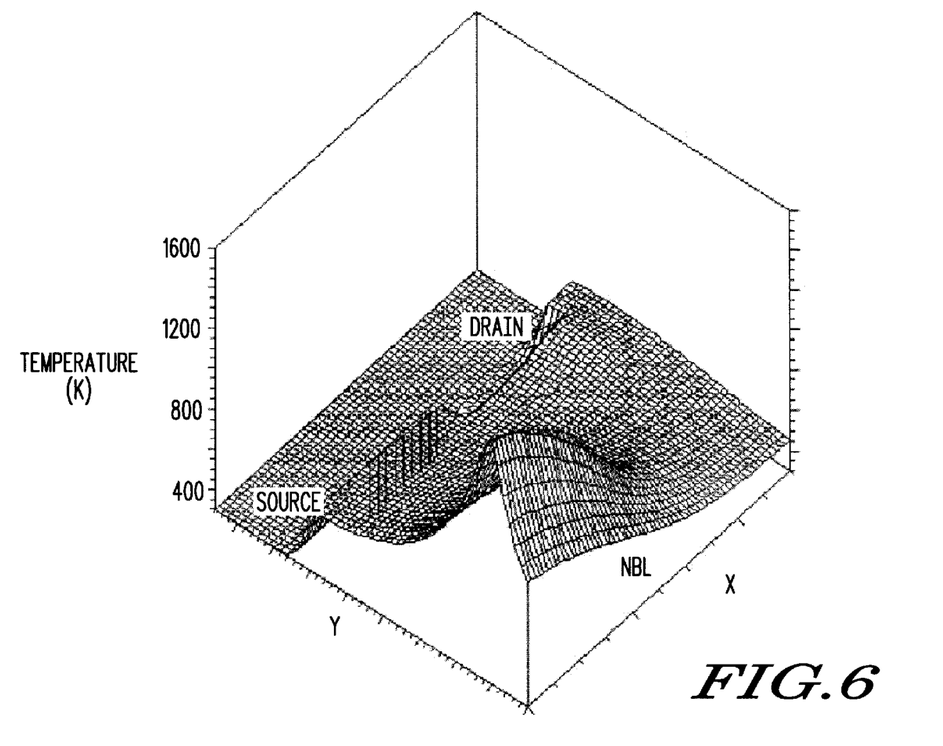
FIG. 6 is a temperature profile for a semiconductor component according to an embodiment of the invention.

The lateral bipolar current path is suppressed in the deep drain device and the parasitic bipolar junction transistor current is forced to flow vertically into the NBL region as shown in FIG. 5. The vertical bipolar current is spread almost along the entire length of the device crosssection, resulting in a significant reduction of the power density. The sharp localized temperature increase near the drain junction characteristic of the shallow drain device is thus avoided in the deep drain device. FIG. 6, which is a temperature profile for a semiconductor component according to an embodiment of the invention, shows that the peak temperature of the deep drain device is located in the silicon bulk near the edge of the, NBL junction, and is spread over a larger volume of silicon.

Figure 7:
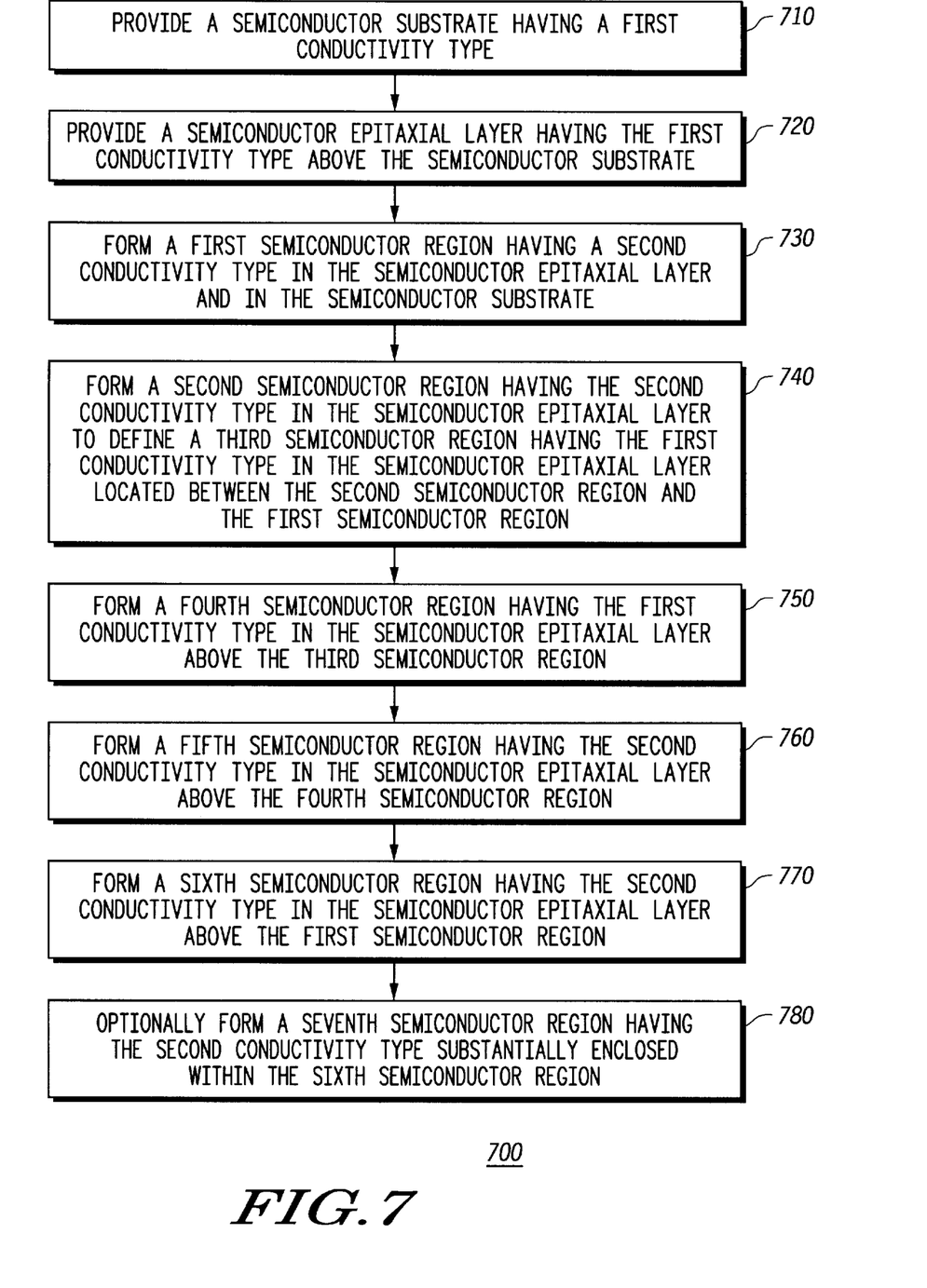
FIG. 7 is a flow diagram illustrating a method of manufacturing a semiconductor component according to an embodiment of the invention.

Refer now to FIG. 7, which is a flow diagram illustrating a method 700 of manufacturing a semiconductor component according to an embodiment of the invention. A step 710 of method 700 is to provide a semiconductor substrate having a first conductivity type. As an example, the semiconductor substrate can be similar to semiconductor region 110 in FIG. 1 and semiconductor region 210 in FIG. 2. A step 720 of method 700 is to provide a semiconductor epitaxial layer having the first conductivity type above the semiconductor substrate. As an example, the semiconductor epitaxial layer can be similar to semiconductor epitaxial layer 111 in FIG. 1 and semiconductor epitaxial layer 211 in FIG. 2.

A step 730 of method 700 is to form a first semiconductor region having a second conductivity type in the semiconductor epitaxial layer and in the semiconductor substrate. As an example, the first semiconductor region can be similar to semiconductor region 120 in FIG. 1 and semiconductor region 220 in FIG. 2. In a different embodiment, step 730 can be performed before or simultaneously with step 720. A step 740 of method 700 is to form a second semiconductor region having the second conductivity type in the semiconductor epitaxial layer to define a third semiconductor region having the first conductivity type in the semiconductor epitaxial layer located between the second semiconductor region and the first semiconductor region. As an example, the second semiconductor region can be similar to semiconductor region 140 in FIG. 1 and semiconductor region 240 in FIG. 2. As a further example, the third semiconductor region can be similar to semiconductor region 130 in FIG. 1 and semiconductor region 230 in FIG. 2.

A step 750 of method 700 is to form a fourth semiconductor region having the first conductivity type in the semiconductor epitaxial layer and above the third semiconductor region. As an example, the fourth semiconductor region can be similar to semiconductor region 150 in FIG. 1 and semiconductor region 250 in FIG. 2. In one embodiment of method 700, step 750 comprises forming the fourth semiconductor region such that it substantially overlaps the second semiconductor region.

In one embodiment of method 700, step 740 further comprises defining a first portion of the third semiconductor region under the fourth semiconductor region, and forming a second portion of the third semiconductor region under the second semiconductor region. As an example, the first portion of the third semiconductor region can be similar to portion 231 in FIG. 2. As a further example, the second portion of the third semiconductor region can be similar to portion 232 in FIG. 2. In a particular embodiment of method 700, step 740 further comprises defining a doping concentration of the first portion of the third semiconductor region to be less than a doping concentration of the second portion of the third semiconductor region.

A step 760 of method 700 is to form a fifth semiconductor region having the second conductivity type in the semiconductor epitaxial layer and above the fourth semiconductor region. As an example, the fifth semiconductor region can be similar to semiconductor region 160 in FIG. 1 and semiconductor region 260 in FIG. 2. In one embodiment of method 700, step 760 comprises electrically shorting the fifth semiconductor region to the fourth semiconductor region.

A step 770 of method 700 is to form a sixth semiconductor region having the second conductivity type in the semiconductor epitaxial layer and above the first semiconductor region. As an example, the sixth semiconductor region can be similar to semiconductor region 170 in FIG. 1 and semiconductor region 270 in FIG. 2. In one embodiment of method 700, step 770 comprises forming the sixth semiconductor region adjacent to the second semiconductor region and the third semiconductor region, and further comprises forming the sixth semiconductor region such that it is separated from the fourth semiconductor region. In a particular embodiment of method 700, step 770 comprises forming the sixth semiconductor region such that it is separated from the fourth semiconductor region by more than one micrometer. In the same or another embodiment of method 700, step 770 comprises forming the sixth semiconductor region to be separated from the first semiconductor region. In the same or a different embodiment of method 700, step 770 further comprises forming the sixth semiconductor region to be more heavily doped than both the second semiconductor region and the third semiconductor region.

A step 780 of method 700 is to optionally form a seventh semiconductor region having the second conductivity type substantially enclosed within the sixth semiconductor region. As an example, the seventh semiconductor region can be similar to semiconductor region 180 in FIG. 1 and semiconductor region 280 in FIG. 2.

Although the invention has been described with reference to specific embodiments, it will be understood by those skilled in the art that various changes may be made without departing from the spirit or scope of the invention. Various examples of such changes have been given in the foregoing description. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the semiconductor component discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A semiconductor component comprising:
a first semiconductor region having a first conductivity type;
a second semiconductor region located above the first semiconductor region and having a second conductivity type;
a third semiconductor region located above the second semiconductor region and having the first conductivity type;
a fourth semiconductor region located above the third semiconductor region and having the second conductivity type;
a fifth semiconductor region located above the third semiconductor region and having the first conductivity type;
a sixth semiconductor region substantially enclosed within the fifth semiconductor region and having the second conductivity type; and a seventh semiconductor region located above the first semiconductor region and having the second conductivity type, wherein:
   the seventh semiconductor region is adjacent to the third semiconductor region and the fourth semiconductor region; and
   the seventh semiconductor region is separated from the fifth semiconductor region.

2. The semiconductor component of claim 1 wherein:
the seventh semiconductor region is separated from the second semiconductor region.

3. The semiconductor component of claim 1 wherein:
the third semiconductor region has a first portion and a second portion;
at least a substantial part of the first portion is located under the fifth semiconductor region; and
at least a substantial part of the second portion is located under the fourth semiconductor region.

4. The semiconductor component of claim 3 wherein:
a doping concentration of the first portion is less than a doping concentration of the second portion.

5. The semiconductor component of claim 1 further comprising:
an eighth semiconductor region located above the seventh semiconductor region and having the second conductivity type.

6. The semiconductor component of claim 5 wherein:
the eighth semiconductor region is substantially enclosed within the seventh semiconductor region.

7. The semiconductor component of claim 5 wherein:
the first, second, third, fourth, fifth, sixth, seventh, and eighth semiconductor regions form portions of a lateral double diffused metal oxide semiconductor field effect transistor;
the sixth semiconductor region comprises a source region; and
the eighth semiconductor region comprises a drain region.

8. The semiconductor component of claim 5 wherein:
the first, second, third, fourth, fifth, sixth, seventh, and eighth semiconductor regions form portions of a bipolar junction transistor;
the sixth semiconductor region comprises an emitter region; and
the eighth semiconductor region comprises a collector region.

9. The semiconductor component of claim 1 wherein:
the fifth semiconductor region and the sixth semiconductor region are electrically shorted together.

10. The semiconductor component of claim 1 wherein:
the seventh semiconductor region is more heavily doped than both the fourth semiconductor region and the third semiconductor region.

11. The semiconductor component of claim 1 wherein:
the fifth semiconductor region and the seventh semiconductor region are separated by more than one micrometer.

12. A semiconductor component comprising:
a first semiconductor region having a first conductivity type;
a semiconductor epitaxial layer located above the first semiconductor region and having the first conductivity type;
a second semiconductor region located in the first semiconductor region and in the semiconductor epitaxial layer and having a second conductivity type;
a third semiconductor region located in the semiconductor epitaxial layer, located above and at least partially contiguous with the second semiconductor region, and having the first conductivity type;
a fourth semiconductor region located in the semiconductor epitaxial layer, located above and at least partially contiguous with the third semiconductor region, and having the second conductivity type;
a fifth semiconductor region located in the semiconductor epitaxial layer, located above and at least partially contiguous with the third semiconductor region, and having the first conductivity type;
a sixth semiconductor region located in the semiconductor epitaxial layer, substantially enclosed within the fifth semiconductor region, and having the second conductivity type; and
a seventh semiconductor region located in the semiconductor epitaxial layer, located above the second semiconductor region, and having the second conductivity type, wherein:
   the seventh semiconductor region is adjacent to the third semiconductor region and the fourth semiconductor region;
   the seventh semiconductor region is completely separated from the fifth semiconductor region by the fourth semiconductor region and the third semiconductor region;
   the second semiconductor region, the fourth semiconductor region, and the seventh semiconductor region deplete the third semiconductor region when a reverse bias is applied between the fourth semiconductor region and the fifth semiconductor region; and
   the second semiconductor region, the sixth semiconductor region, and the seventh semiconductor region are more heavily doped that the first semiconductor region, the third semiconductor region, the fourth semiconductor region, and the fifth semiconductor region.

13. The semiconductor component of claim 12 wherein:
the seventh semiconductor region is separated from the second semiconductor region.

14. The semiconductor component of claim 12 wherein:
the third semiconductor region has a first portion and a second portion;
at least a substantial part of the first portion is under the fifth semiconductor region; and
at least a substantial part of the second portion is under the fourth semiconductor region.

15. The semiconductor component of claim 14 wherein:
a doping concentration of the first portion is less than a doping concentration of the second portion.

16. The semiconductor component of claim 12 further comprising:
an eighth semiconductor region above the seventh semiconductor region and having the second conductivity type.

17. The semiconductor component of claim 16 wherein:
the eighth semiconductor region is substantially enclosed within the seventh semiconductor region.

18. The semiconductor component of claim 16 wherein:
the first, second, third, fourth, fifth, sixth, seventh, and eighth semiconductor regions form portions of a lateral double diffused metal oxide semiconductor field effect transistor;

the sixth semiconductor region comprises a source region; and the eighth semiconductor region comprises a drain region.

19. The semiconductor component of claim 16 wherein:

the first, second, third, fourth, fifth, sixth, seventh, and eighth semiconductor regions form portions of a bipolar junction transistor;

the sixth semiconductor region comprises an emitter region; and the eighth semiconductor region comprises a collector region.

20. The semiconductor component of claim 12 wherein:

the fifth semiconductor region and the seventh semiconductor region are separated by more than one micrometer.

21. A method of manufacturing a semiconductor component, the method comprising:

providing a composite substrate comprising a semiconductor epitaxial layer above a semiconductor substrate, the composite substrate having a first conductivity type;

forming a first semiconductor region in the semiconductor epitaxial layer and in the semiconductor substrate, the first semiconductor region having a second conductivity type;

forming a second semiconductor region in the semiconductor epitaxial layer to define a third semiconductor region in the semiconductor epitaxial layer located between the second semiconductor region and the first semiconductor region, the second semiconductor region having the second conductivity type and the third semiconductor region having the first conductivity type;

forming a fourth semiconductor region in the semiconductor epitaxial layer above the third semiconductor region and having the first conductivity type;

forming a fifth semiconductor region in the semiconductor epitaxial layer above the fourth semiconductor region and having the second conductivity type;

forming a sixth semiconductor region in the semiconductor epitaxial layer above the first semiconductor region and having the second conductivity type, wherein:

the sixth semiconductor region is adjacent to the second semiconductor region and the third semiconductor region; and the sixth semiconductor region is separated from the fourth semiconductor region.

22. The method of claim 21 further comprising:

forming the sixth semiconductor region to be separated from the first semiconductor region.

23. The method of claim 21 further comprising:

defining a first portion of the third semiconductor region under the fourth semiconductor region; and forming a second portion of the third semiconductor region under the second semiconductor region.

24. The method of claim 23 further comprising:

defining a doping concentration of the first portion to be less than a doping concentration of the second portion.

25. The method of claim 21 further comprising:

forming a seventh semiconductor region substantially enclosed within the sixth semiconductor region and having the second conductivity type.

26. The method of claim 21 further comprising:

electrically shorting the fifth semiconductor region to the fourth semiconductor region.

27. The method of claim 21 further comprising:

forming the sixth semiconductor region to be more heavily doped than both the second semiconductor region and the third semiconductor region.

28. The method of claim 21 further comprising:

forming the sixth semiconductor region such that it is separated from the fourth semiconductor region by more than one micrometer.

* * * * *